United States Patent [19]

Blow et al.

[11] Patent Number: 4,853,933
[45] Date of Patent: Aug. 1, 1989

[54] NON-TRANSFORM LIMITED PULSE LOCKED RADIATION MODE RADIATION GENERATOR WITH EXTERNAL CAVITY HAVING NON-LINEAR TRANSMISSION CHARACTERISTIC IMPROVING MODE LOCKING

[75] Inventors: Keith J. Blow; David C. Wood, both of Woodbridge, England

[73] Assignee: British Telecommunications, London, England

[21] Appl. No.: 113,820

[22] PCT Filed: Feb. 2, 1987

[86] PCT No.: PCT/GB87/00072
§ 371 Date: Sep. 30, 1987
§ 102(e) Date: Sep. 30, 1987

[87] PCT Pub. No.: WO87/04871
PCT Pub. Date: Aug. 13, 1987

[30] Foreign Application Priority Data

Feb. 3, 1986 [GB] United Kingdom .............. 8602578
Jul. 24, 1986 [GB] United Kingdom .............. 8618117

[51] Int. Cl.$^4$ ............................................. H01S 3/098
[52] U.S. Cl. ........................................ 372/18; 372/21; 372/97; 372/105; 307/426
[58] Field of Search .............. 372/18, 21, 92, 97, 372/105; 307/426

[56] References Cited

U.S. PATENT DOCUMENTS

| | | | |
|---|---|---|---|
| 3,975,693 | 8/1976 | Barry et al. | 372/18 |
| 4,019,156 | 4/1977 | Fountain et al. | 372/18 |
| 4,025,875 | 5/1977 | Fletcher et al. | 372/18 |
| 4,180,751 | 12/1979 | Ammann | 307/428 |
| 4,268,801 | 5/1981 | Stappaerts | 372/18 |
| 4,435,808 | 4/1984 | Javan | 372/11 |
| 4,635,263 | 1/1987 | Mollenauer | 372/18 |

FOREIGN PATENT DOCUMENTS 2731112 1/1979 Fed. Rep. of Germany .

OTHER PUBLICATIONS

Optics Communications, vol. 56, No. 4, Dec. 1985 (Amsterdam, NL), L. K. Johnson et al: "Self Frequency-Locking of Dye Laser Emission to the Center of an Intracavity Absorption Frequency", pp. 275–278.
Optics Letters, vol. 9, No. 1, Jan. 1984 (New York, US), L. F. Mollenauer et al.; "The Soliton Laser", pp. 13–15.

Primary Examiner—William L. Sikes
Assistant Examiner—B. R. R. Holloway
Attorney, Agent, or Firm—Nixon & Vanderhye

[57] ABSTRACT

A radiation generator in which substantially all the radiation modes are locked with respect to one another comprises a radiation generating cavity defined by mirrors and a crystal for generating a continuous train of non-transform limited pulses of coherent radiation. An external cavity is positioned in association with the radiation generating cavity whereby radiation may pass in use in both directions between the two cavities. The external cavity is defined by a medium having a non-linear transmission characteristic which may be substantially non-dispersive for radiation from the generating cavity, and/or which has a negative group delay dispersion. The radiation path length is such that pulses fed into the external cavity are fed back to the radiation generating cavity in synchronism with a later pulse from the generating cavity.

10 Claims, 1 Drawing Sheet

SATURABLE ABSORBER

SATURABLE AMPLIFIER

NON-TRANSFORM LIMITED PULSE LOCKED RADIATION MODE RADIATION GENERATOR WITH EXTERNAL CAVITY HAVING NON-LINEAR TRANSMISSION CHARACTERISTIC IMPROVING MODE LOCKING

FIELD OF THE INVENTION

The invention relates to radiation generators in which substantially all the radiation modes are locked with respect to one another.

BACKGROUND AND SUMMARY OF THE INVENTION

The invention is particularly concerned with improving the mode locking performance of imperfectly mode locked lasers producing non-transform limited pulses. Short, transform limited pulses are achieved by ensuring that the lasing modes have a specific phase relationship to each other. If all the modes within the laser gain curve could be locked then the laser pulse width would only depend on the gain bandwidth. In most lasers the extent to which this can be achieved is limited by the physical properties of the mode locking element. In a Nd:YAG laser the limitation is the modulation depth and in F centre laser the limitation is the thermal destruction of the lasing medium.

In a paper entitled "The Soliton Laser" published in Optics Letters Vol 9, page 13, 1984, a method of improving the mode locking performance of lasers is described. This method consists in selecting a particular length of optical fibre to form a feedback loop. The idea behind this proposal was to reinject the light from the fibre into the laser cavity so as to force the laser to produce solitons in the optical fibre. The authors suggest that the reason why this improves a mode locked laser is due to the periodic nature of the solitons in their propagation along the fibre. This results in a stable operating point as the input and output pulses of the fibre are identical thus leaving the circulating pulses in the laser cavity undisturbed.

In a later paper by LF Mollenauer entitled "Solitons in Optical Fibres and the Soliton Laser" in Phil. Trans. R. Soc. Lond. A 315,437–450 (1985) it is indicated that soliton effects are possible only in the region of negative group velocity dispersion. This has a limiting effect on the wavelengths which can be produced using a soliton laser. The wavelength used typically is 1.55μm. A further problem is in the difficulty of selecting an appropriate medium for the external cavity. The papers mentioned above both indicate that the non-linear and dispersive affects of the medium are equally important and it is necessary to select a medium in which these two effects exactly balance one another or at least nearly balance so that the frequency modifications imposed on the pulse by the two effects are of opposite sign and cancel each other out. This again leads to limitations in the type of media which can be chosen for the external cavity. Furthermore, very high peak powers are required in the fibre cavity.

In accordance with a first aspect of the present invention, a radiation generator in which substantially all the radiation modes are locked with respect to one another comprises a radiation generating cavity for generating a continuous train of non-transform limited pulses of coherent radiation; an external cavity positioned in association with the radiation generating cavity whereby radiation may pass in use in both directions between the two cavities, the external cavity being defined by a medium having a non-linear loss characteristic which predominates over any non-linear refractive index property of the medium, as hereinafter defined, for radiation from the generating cavity, and having a radiation path length such that pulses fed into the external cavity are fed back to the radiation generating cavity in synchronism with a later pulse from the generating cavity.

In accordance with a second aspect of the present invention, a radiation generator in which substantially all the radiation modes are locked with respect to one another comprises a radiation generating cavity for generating a continuous train of non-transform limited pulses of coherent radiation; an external cavity positioned in association with the radiation generating cavity whereby radiation may pass in use in both directions between the two cavities, the external cavity being defined by a medium which has a non-linear transmission characteristic, as hereinafter defined, for radiation from the generating cavity and a negative group delay dispersion, and which defines a radiation path length such that pulses fed into the external cavity are fed back to the radiation generating cavity in synchronism with a later pulse from the generating cavity.

In accordance with a third aspect of the present invention a radiation generator in which substantially all the radiation modes are locked with respect to one another comprises a radiation generating cavity for generating a continuous train of non-transform limited pulses of coherent radiation; an external cavity positioned in association with the radiation generating cavity whereby radiation may pass in use in both directions between the two cavities, the external cavity being defined by a medium which has a non-linear transmission characteristic, as hereinbefore defined, for radiation from the generating cavity and which does not support soliton propagation therein, and which defines a radiation pathlength such that pulses fed into the external cavity are fed back to the radiation generating cavity in synchronism with a later pulse from the generating cavity.

We have constructed a mathematical model of the soliton laser described in the paper mentioned above. This model reproduces the main features of the experiment and indicates, surprisingly, that the generation of solitons is not the reason why an improvement in mode locking is achieved. We have deduced an alternative explanation which is that it is the non-linearity in the external cavity which provides a means for the higher frequency modes to communicate and hence lock their phases together. The only role of the mode locking element in the laser cavity is to provide a timing for the pulses.

On the basis of this explanation, we predicted that the soliton nature of the fibre was unnecessary and that the important feature was a non-linear medium. Using our model, we replaced the optical fibre by another, simple non-linear element such as a saturable absorber and have shown that a similar improvement in mode locking performance is achieved.

This discovery leads to significant advantages being achieved over the previous proposal. It is not necessary to select a medium in which the non-linear and dispersive affects are approximately or exactly balanced. Instead, it is sufficient to consider the non-linearity of the medium, for example whether non-linear losses predominate over any non-linear refractive index or whether, if the medium has a predominant non-linear refractive index, it also has negative group delay dispersion effect. The removal of the requirement for soliton generation also means that a wider range of wavelengths may be generated and lower peak powers are possible. This leads to the possibility of using an external cavity to improve the mode locking of other lasers which cannot produce sufficient power for there to be a significant non-linear effect in an optical external cavity.

In this specification, by "non-linear transmission" we mean that the refractive index and/or loss of the external cavity is a function of the intensity of the injected radiation at a given frequency. In optical fibres this is essentially the Kerr effect in which the refractive index (and hence the phase velocity) changes proportionally to intensity. In other materials the loss changes with intensity. The effects of these non-linearities considered is on the shaping of the pulses.

By "dispersive" we mean that the group velocity is a function of wavelength or frequency.

Preferably, the medium defining the external cavity has a negative group delay dispersion (or a positive group velocity dispersion). This is useful since many materials have such a property and this enables a wider range of wavelengths to be generated. For example the radiation generating cavity could be provided by a Nd:YAG laser.

In other examples substantially non-dispersive media may be used for the external cavity such as saturable absorbers and saturable amplifiers. An example of a saturable absorber is a semiconductor laser operating below threshold. A saturable amplifier may operate on a four wave mixing process (which includes frequency doubling). For such media, the non-linearity affects the loss, rather than the refractive index.

An optical fibre could be used in an example according to the second or third aspects of the invention but with a length different from that needed to propagate solitons. In this case, the radiation injected into the optical fibre would need a high intensity.

Although the invention is particularly applicable for use with lasers, the invention is also applicable to radiation at non-optical wavelengths.

In this context, the term optical is intended to refer to that part of the electro-magnetic spectrum which is generally known as the visible region together with those parts of the infra-red and ultra-violet regions at each end of the visible region which are capable of being transmitted by dielectric optical waveguides such as optical fibres.

The external cavity may conveniently include a reflector positioned downstream of the medium so that radiation transmitted through the medium is reflected back into the cavity and back to the radiation generating cavity.

Alternatively, where an optical fibre is used to define the external cavity, this may be formed in a loop starting and terminating adjacent the generating cavity. It is preferable if monomode fibre is used and we believe it is also preferable for the fibre to be polarisation-preserving.

BRIEF DESCRIPTION OF THE DRAWINGS

Some examples of radiation generators and methods for their construction in accordance with the present invention will now be described with reference to the accompanying drawings, in which.

DETAILED DESCRIPTION OF PREFERRED EMBODIMENT

Figure 1:
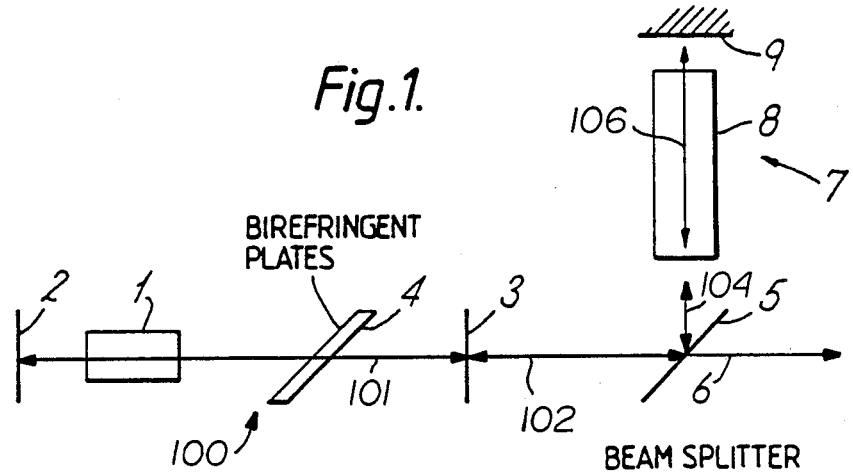
FIG. 1 illustrates diagrammatically the layout of the generator.

The apparatus illustrated schematically in FIG. 1 comprises a Nd:YAG cavity 1 positioned between a pair of mirrors 2, 3 defining a laser cavity 100 (with an optical path 101 being defined between mirrors 2,3). Birefringent plates 4 are positioned between the crystal 1 and the mirror 3.

The cavity 1 is axially pumped with radiation with a wavelength of for example 1.06$\mu$m through the mirror 2, synchronously with the cavity and generates a train of imperfectly mode locked pulses (not shown). The mirror 3 is partially reflecting so that radiation passes through the mirror 3 along a path 102 and impinges on a beam splitter 5. Part of the impinging radiation passes through the beam splitter 5 as indicated by an arrow 6.

The remainder of the radiation is reflected by the beam splitter 5 into an external cavity 7 along a path 104.

The external cavity 7 comprises a non-linear medium 8 into which the beam reflected from the splitter 5 is injected along a path 106 and a mirror 9 downstream of the medium 8.

The non-linear medium 8 may be constituted by a dispersive or non-dispersive device. For example, the medium 8 could be constituted by a saturable absorber or a saturable amplifier which are substantially non-dispersive devices having quite different characteristics but in which the non-linear loss effects predominate over any dispersive effects and non-linear refractive index effects. We have determined mathematically that both of these devices lead to shorter pulses.

Saturable absorbers have an absorbtion coefficient which decreases with the intensity of the incident light. Thus at low intensities the light is absorbed and at high intensities it is transmitted. This characteristic leads to pulses being narrower after transmission than before since the wings of the pulses are effectively removed.

Saturable amplifiers have a gain coefficient which reduces with increase of incident light intensity. Thus at low intensities the light is amplified and at high intensities it is transmitted almost unchanged (as for the saturable absorber). This characteristic leads to pulses being broader after transmission as the wings of the pulse are amplified but the centre is not.

These two devices are modelled by the following equation for the absorber $$A^{out} = \frac{A^{in}|A^{in}|2}{1 + |A^{in}|2}$$

and by this equation for the amplifier $$A^{out} = \frac{A^{in}}{1 + |A^{in}|^2}$$

Figure 2:
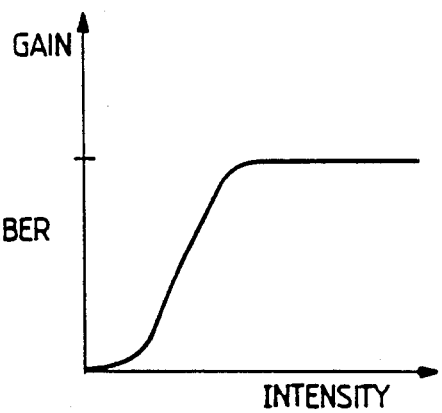
FIGS. 2 and 3 illustrate graphically the gain characteristics of a saturable absorber and a saturable amplifier respectively.
Figure 3:
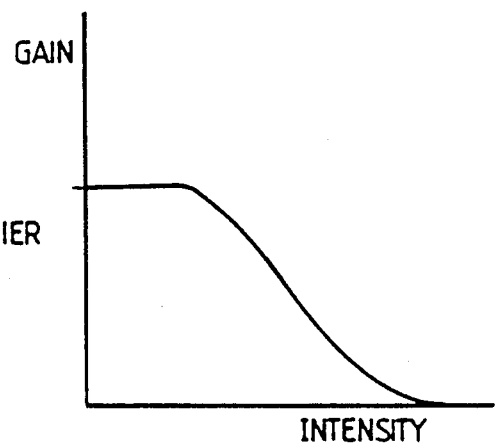

The gain of the two devices is shown in FIGS. 2 and 3. It should be emphasised that these two models represent the two extremes of pulse compression and pulse dispersion. In both cases it is possible to find model parameters where improved mode locking performance is obtained. The only important distinction between the two sets of parameters is the phase matching of the two cavities which differs by half a wavelength.

In other examples, the medium 8 may be constituted by a monomode optical fibre having a relatively short length.

We claim:

1. A radiation generator in which substantially all radiation modes are locked with respect to one another, comprising:
   a radiation generating cavity means for generating a continuous train of non-transform limited pulses of coherent radiation; and
   an external cavity adjacent and coupled to said radiation generating cavity coupling between the radiation generating cavity means and the external cavity permitting radiation to pass in both directions between the radiation generating cavity means and the external cavity, the external cavity including a medium having a non-linear loss characteristic which predominates over any non-linear refractive index property of said medium for radiation from the radiation generating cavity means, and having a radiation path length such that pulses fed into the external cavity are fed back to the radiation generating cavity means in synchronism with a later pulse from the radiation generating cavity means.

2. A radiation generator in which substantially all radiation modes are locked with respect to one another, comprising:
   a radiation generating cavity for generating a continuous train of non-transform limited pulses of coherent radiation; and
   an external cavity adjacent said radiation generating cavity whereby radiation may pass in both directions between said radiation generating cavity and said external cavity, the external cavity including a medium having a non-linear transmission characteristic for radiation from the radiation generating cavity, said medium comprising means for supporting no soliton propagation therein and for defining a radiation path length dimensioned to feed pulses fed into the external cavity back to the radiation generating cavity in synchronism with later pulses from the generating cavity.

3. A generator according to claim 1 or claim 2, wherein said medium comprises a structure having a negative group delay dispersion.

4. A radiation generator in which substantially all radiation modes are locked with respect to one another, comprising:
   a radiation generating cavity for generating a continuous train of non-transform limited pulses of coherent radiation; and
   an external cavity adjacent said radiation generating cavity and including means for coupling radiation in both directions between said radiation generating cavity and said external cavity, said external cavity further including a medium which has a non-linear transmission characteristic for radiation from said radiation generating cavity and a negative group delay dispersion, and which defines a radiation path length such that pulses fed into the external cavity are fed back to the radiation generating cavity in synchronism with a later pulse from the generating cavity.

5. A generator according to any of claims 2 or 4, wherein the external cavity comprises an optical fibre.

6. A generator according to any of claims 1, 2 or 4, wherein the external cavity comprises a saturable absorber.

7. A generator according to any of claims 1, 2 or 4, wherein the external cavity comprises a saturable amplifier.

8. A mode locked radiation generator comprising:
   radiation generating cavity means for generating a first continuous train of non-transform limited pulses of coherent radiation of a certain wavelength, said radiation cavity means including means for defining a first optical feedback path internal thereto; and
   external cavity means for providing a further continuous train of coherent radiation pulses in response to said first pulse train and for injecting said further radiation pulse train into said radiation generating cavity means in synchronism with the pulses of said first radiation pulse train, said external cavity means including:
   means for defining a second optical feedback path internal to said external cavity means, said second optical feedback path including no part of said first optical feedback path, said first optical feedback path including no part of said second optical feedback path,
   a medium disposed along said second optical feedback path, said medium having a non-linear loss characteristic which predominates over any non-linear refractive index property of said medium at said certain wavelength, and
   means for coupling said first radiation pulse train propagating along said first optical feedback path from said first path to said second optical feedback path and for coupling said second radiation pulse train propagating along said second optical feedback path from said second path to said first optical feedback path.

9. A mode locked radiation generator comprising:
   radiation generating cavity means for generating a first continuous train of non-transform limited pulses of coherent radiation of a certain wavelength, said radiation cavity means including means for defining a first optical feedback path internal thereto; and
   external cavity means for providing a further continuous train of coherent radiation pulses in response to said first pulse train and for injecting said further radiation pulse train into said radiation generating cavity means in synchronism with the pulses of said first radiation pulse train, said external cavity means including:
   means for defining a second optical feedback path internal to said external cavity means, said second optical feedback path including no part of said first optical feedback path, said first optical feedback path including no part of said second optical feedback path,
   a medium disposed along said second optical feedback path, said medium having a non-linear transmission characteristic for radiation at said certain wavelength, said medium being incapable of supporting soliton propagation therein, and
   means for coupling said first radiation pulse train propagating along said first optical feedback path from said first path to said second optical feedback path and for coupling said second radiation pulse train propagating along said second optical feedback path from said second path to said first optical feedback path.

10. A mode locked radiation generator comprising:
radiation generating cavity means for generating a first continuous train of non-transform limited pulses of coherent radiation of a certain wavelength, said radiation cavity means including means for defining a first optical feedback path internal thereto; and
external cavity means for providing a further continuous train of coherent radiation pulses in response to said first pulse train and for injecting said further radiation pulse train into said radiation generating cavity means in synchronism with the pulses of said first radiation pulse train, said external cavity means including:

means for defining a second optical feedback path internal to said external cavity means, said second optical feedback path including no part of said first optical feedback path, said first optical feedback path including no part of said second optical feedback path,
a medium disposed along said second optical feedback path, said medium having a non-linear transmission characteristic at said certain wavelength and a negative group delay dispersion, and
means for coupling said first radiation pulse train propagating along said first optical feedback path from said first path to said second optical feedback path and for coupling said second radiation pulse train propagating along said second optical feedback path from said second path to said first optical feedback path.

* * * * *